(12) United States Patent
Endo et al.

(10) Patent No.: US 11,323,045 B2
(45) Date of Patent: May 3, 2022

(54) VIBRATION DEVICE HAVING CUSHIONING MATERIAL WITH REDUCED THICKNESS

(71) Applicant: Murata Manufacturing Co., Ltd., Nagaokakyo (JP)

(72) Inventors: Jun Endo, Nagaokakyo (JP); Junichi Hashimoto, Nagaokakyo (JP); Shozo Otera, Nagaokakyo (JP); Toru Tominaga, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 214 days.

(21) Appl. No.: 15/931,846

(22) Filed: May 14, 2020

(65) Prior Publication Data

US 2020/0373857 A1 Nov. 26, 2020

(30) Foreign Application Priority Data

May 24, 2019 (JP) .............................. JP2019-097562

(51) Int. Cl.
*H02N 2/00* (2006.01)
*B06B 1/06* (2006.01)

(52) U.S. Cl.
CPC ........... *H02N 2/004* (2013.01); *B06B 1/0648* (2013.01); *H02N 2/005* (2013.01); *B06B 1/0666* (2013.01)

(58) Field of Classification Search
CPC .... H02N 2/004; H02N 2/005; H01L 41/0986; H01L 41/193; H01L 41/053; B06B 1/0648; B06B 1/0666; B06B 1/0688
See application file for complete search history.

(56) References Cited

U.S. PATENT DOCUMENTS 10,716,541 B2    7/2020   Kiyose et al.
2010/0308694 A1* 12/2010 Numata ............... H03H 9/1021
                                                                        29/25.35
(Continued)

FOREIGN PATENT DOCUMENTS

CN     106362934 A    2/2017
CN     109511261 A    3/2019
(Continued)

OTHER PUBLICATIONS

Chinese Office Action issued for CN 201910977391.5, dated Jul. 2, 2021.
(Continued)

*Primary Examiner* — Emily P Pham
(74) *Attorney, Agent, or Firm* — ArentFox Schiff LLP

(57) ABSTRACT

A vibration device that includes a flat plate that has a first main surface and a second main surface; a vibrator that is configured to vibrate along a first direction parallel to the first main surface; a connecting member that connects the vibrator to the first main surface of the flat plate; a support member having a cavity or a recess in a portion thereof facing the vibrator; and a cushioning material connecting the first main surface of the flat plate to the support member, the cushioning material being disposed so as to not overlap with the vibrator in a plan view of the vibration device. A combined length of the vibrator and the connecting member in a second direction perpendicular to the first main surface of the flat plate is larger than a length of the cushioning material in the second direction.

13 Claims, 4 Drawing Sheets

(56) References Cited

U.S. PATENT DOCUMENTS

| | | | |
|---|---|---|---|
| 2012/0194460 A1* | 8/2012 | Kuwabara | G06F 3/016 345/173 |
| 2017/0020484 A1 | 1/2017 | Kiyose et al. | |
| 2017/0160808 A1* | 6/2017 | Hashimoto | G06F 3/016 |
| 2019/0155391 A1 | 5/2019 | Hashimoto et al. | |
| 2020/0215573 A1 | 7/2020 | Horii et al. | |
| 2020/0295676 A1 | 9/2020 | Ezawa et al. | |
| 2020/0373857 A1 | 11/2020 | Endo et al. | |

FOREIGN PATENT DOCUMENTS

| | | |
|---|---|---|
| CN | 211463771 U | 9/2020 |
| JP | 2011113461 A | 6/2011 |
| JP | 6237959 A | 11/2017 |
| JP | 2019058848 A | 4/2019 |
| JP | 2019062025 A | 4/2019 |
| JP | 2019212265 A | 12/2019 |

OTHER PUBLICATIONS

Japanese Office Action issued for counterpart Japanese Application No. 2019-097562, date of Japanese Office Action dated Nov. 24, 2021.

* cited by examiner

VIBRATION DEVICE HAVING CUSHIONING MATERIAL WITH REDUCED THICKNESS

CROSS REFERENCE TO RELATED APPLICATIONS

The present application claims priority to Japanese Patent Application No. 2019-097562, filed May 24, 2019, the entire contents of which is incorporated herein by reference.

BACKGROUND OF THE INVENTION

Field of the Invention

The present invention relates to a vibration device that generates vibration.

Description of the Related Art

In recent years, a tactile presentation device that transmits vibration when a user touches a touch pad or the like so as to cause the user to have the actual feeling of operation through the touch pad or the like has been proposed.

For example, Japanese Patent No. 6237959 proposes a vibration device that provides tactile feedback to a user by using a piezoelectric film. A conventional vibration device is disposed on top of a housing of an electronic device or the like.

SUMMARY OF THE INVENTION

When the vibration device is disposed on top of a housing of an electronic device or the like, a portion where the vibration device is placed becomes bulky due to the thickness of the vibration device.

In view of the above, an object of the present invention is to provide a vibration device that has less bulkiness when disposed on an electronic device or the like.

A vibration device according to the present invention includes a flat plate that has a first main surface and a second main surface; a vibrator that is configured to vibrate along a first direction parallel to the first main surface; a connecting member that connects the vibrator to the first main surface of the flat plate; a support member having a cavity or a recess in a portion thereof facing the vibrator; and a cushioning material connecting the first main surface of the flat plate to the support member, the cushioning material being disposed so as to not overlap with the vibrator in a plan view of the vibration device. A combined length of the vibrator and the connecting member in a second direction perpendicular to the first main surface of the flat plate is larger than a length of the cushioning material in the second direction.

In this configuration, the support member has the cavity or the recess, and at least part of the vibrator enters the cavity or the recess. In this manner, the cushioning material connecting between the flat plate and the support member can be formed thinner as much as the vibrator enters the space of the support member. Therefore, the vibration device as a whole has less bulkiness since the cushioning material can be formed thin.

According to the present invention, a vibration device has less bulkiness when disposed on an electronic device or the like.

DETAILED DESCRIPTION OF THE INVENTION

Figure 1A:
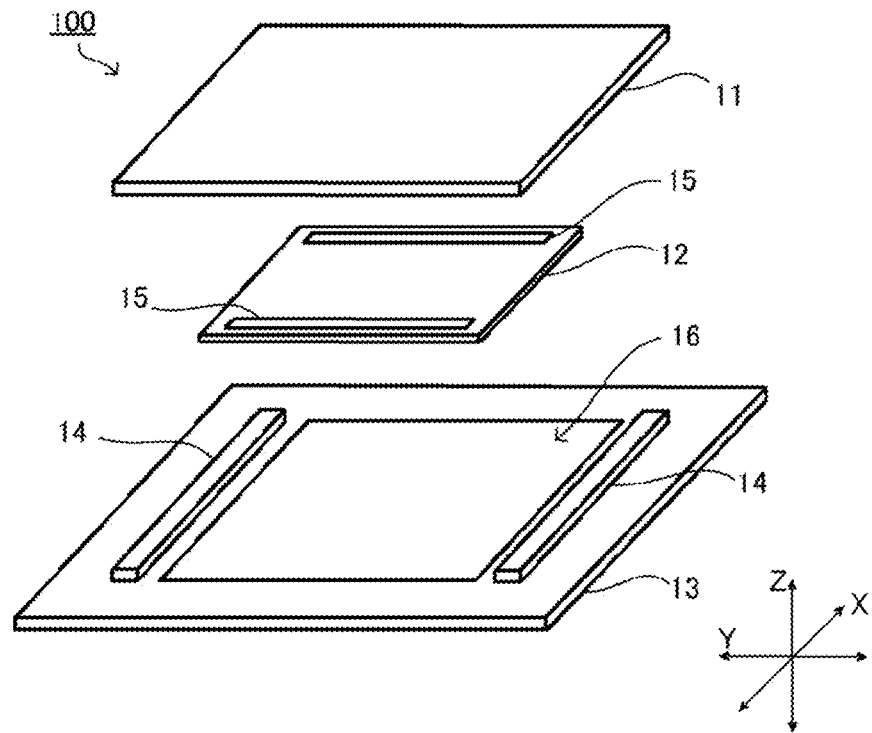
FIG. 1A is an exploded perspective view of a vibration device 100.
Figure 1B:
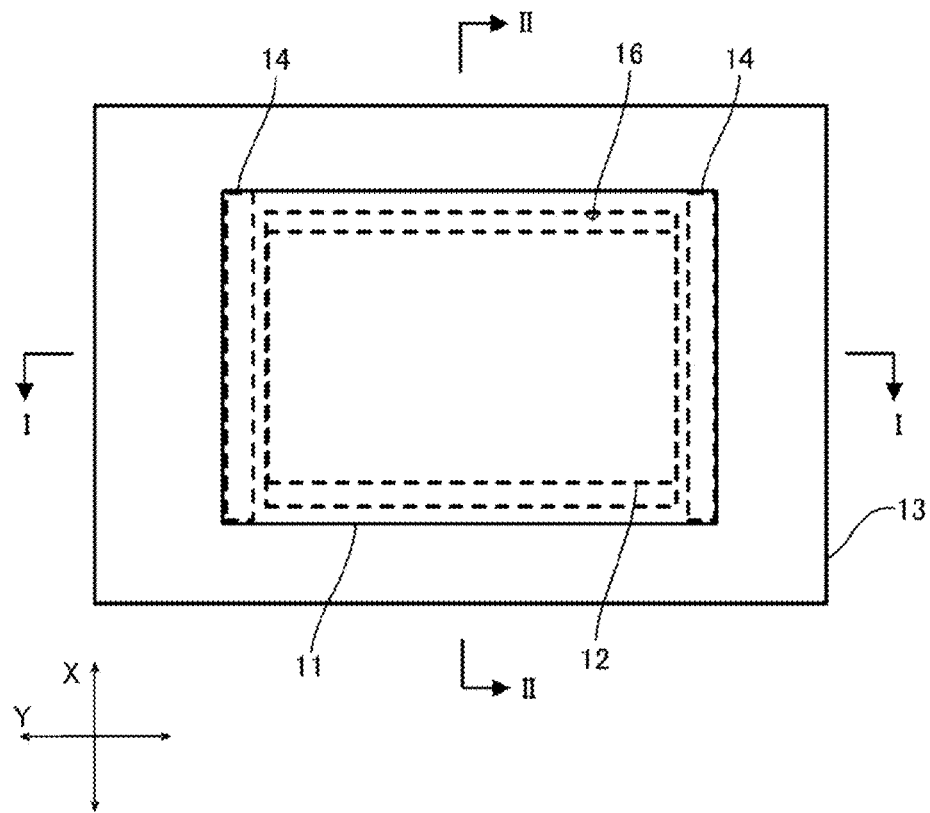
FIG. 1B is a plan view of the vibration device 100.
Figure 2A:
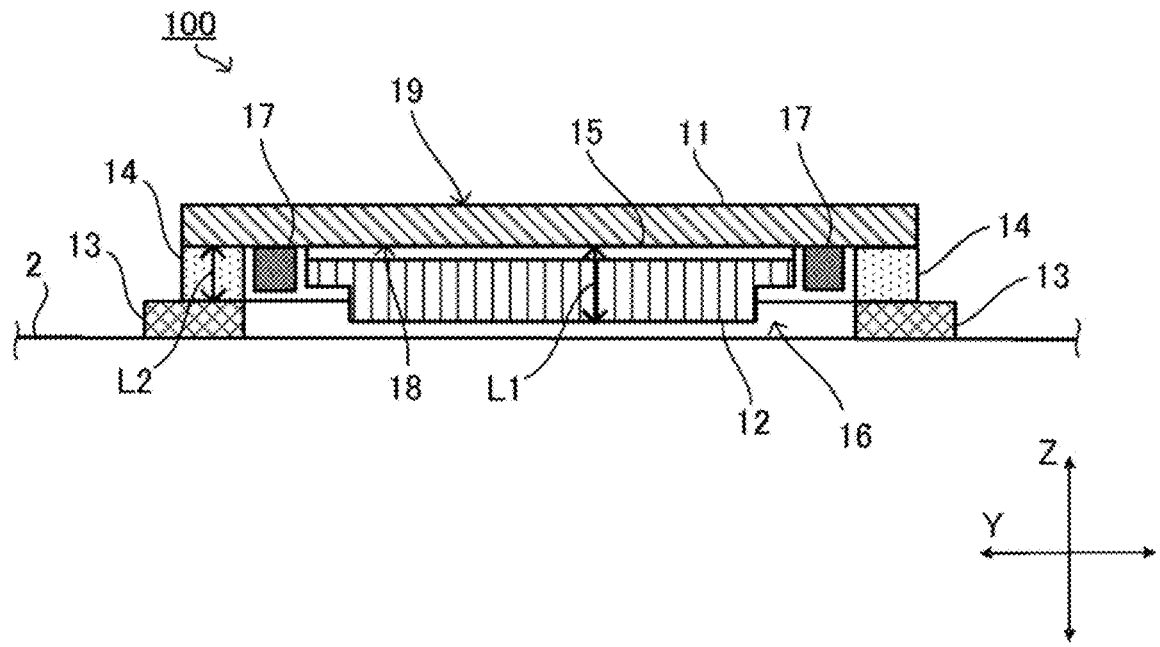
FIG. 2A is a sectional view taken along line I-I shown in FIG. 1B.
Figure 2B:
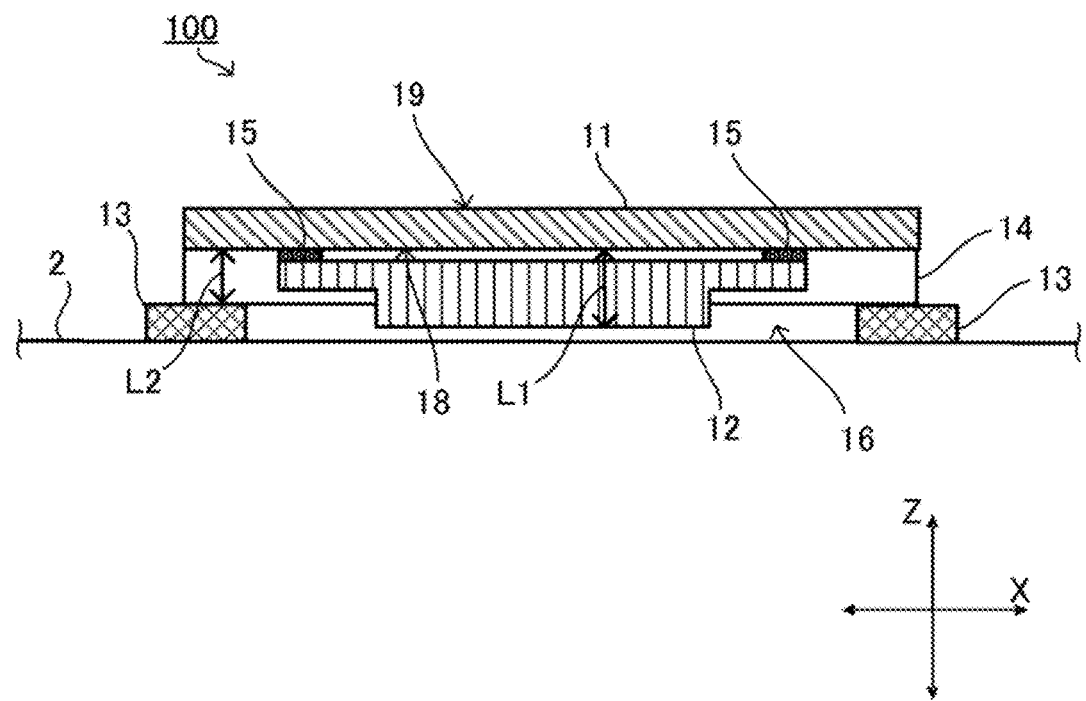
FIG. 2B is a sectional view taken along line II-II shown in FIG. 1B.
Figure 3A:
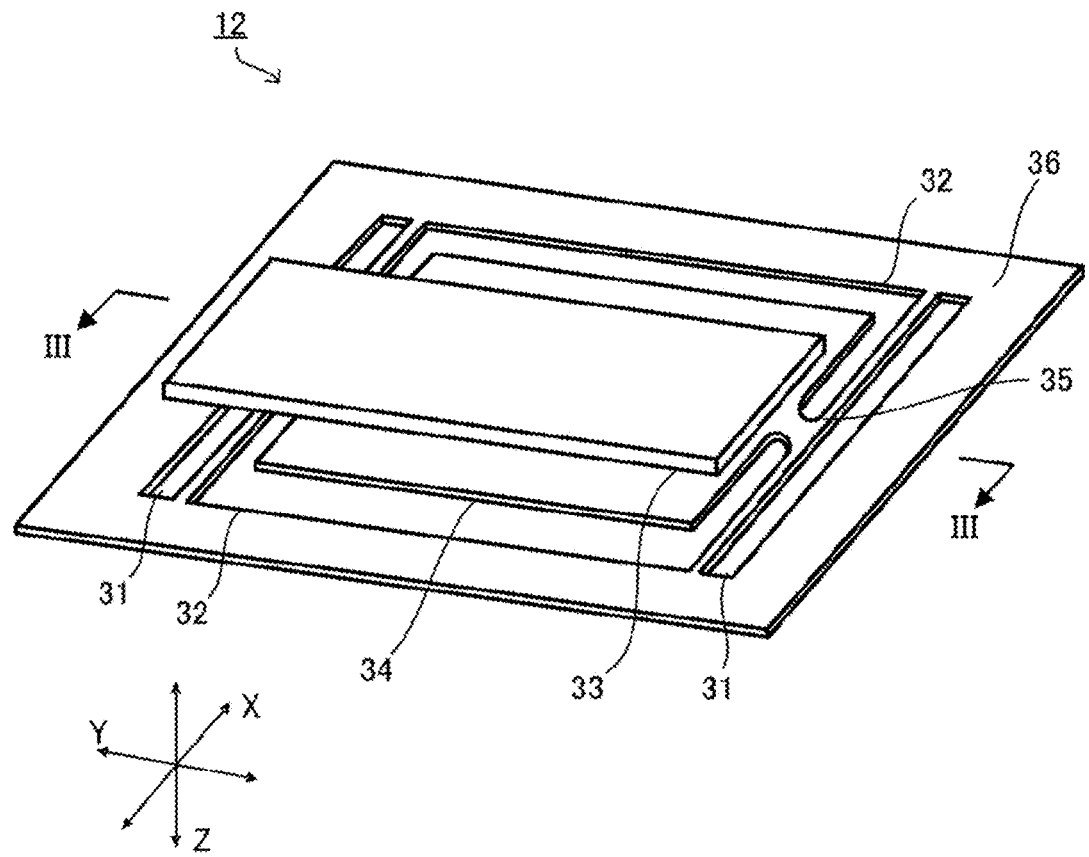
FIG. 3A is a rear perspective view of a vibrator 12.
Figure 3B:
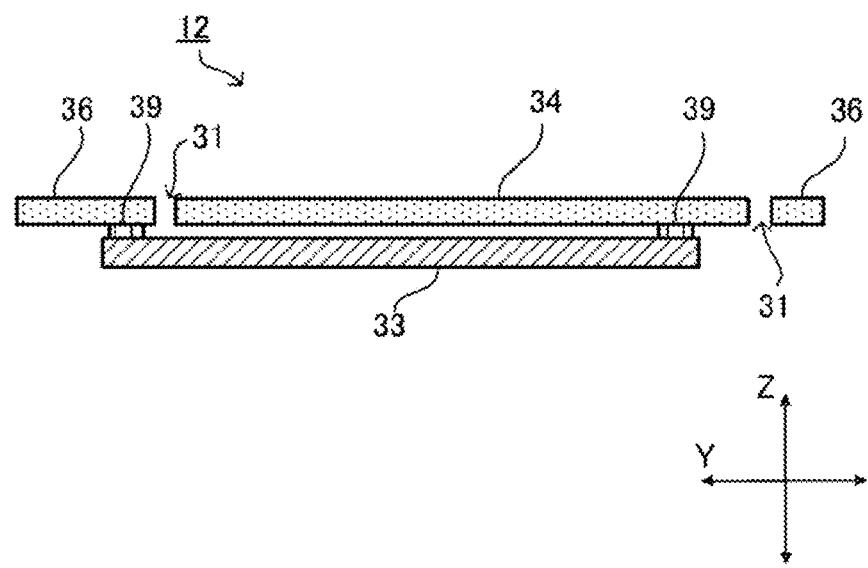
FIG. 3B is a sectional view taken along line III-III shown in FIG. 3A.

FIG. 1A is an exploded perspective view of a vibration device 100, and FIG. 1B is a plan view of the vibration device 100. FIG. 2A is a sectional view taken along line I-I shown in FIG. 1B, and FIG. 2B is a sectional view taken along line II-II shown in FIG. 1B. FIGS. 2A and 2B show a state where the vibration device is disposed on a housing 2 of an electronic device. FIG. 3A is a perspective view of a vibrator 12, and FIG. 3B is a sectional view taken along line III-III shown in FIG. 3A. Note that, in FIG. 1B, a member that overlaps with a substrate 11 is shown by a broken line through the substrate 11. Further, in each diagram other than FIG. 2A, wiring is omitted.

As shown in FIGS. 1A and 1B, the vibration device 100 of the present embodiment includes the substrate 11, the vibrator 12, a holder 13, a cushion material 14, and a double-sided tape 15. In FIGS. 1A and 1B, a width direction (lateral direction) of the vibration device 100 is an X-axis direction, a length direction (vertical direction) is a Y-axis direction, and a thickness direction is a Z-axis direction. Note that the Y-axis direction corresponds to a "first direction" in the present invention, and the Z-axis direction corresponds to a "second direction" in the present invention.

As shown in FIGS. 2A and 2B, the substrate 11 is a flat plate having a first main surface 18 and a second main surface 19. The first main surface 18 and the second main surface 19 are rectangular in a plan view of the vibration device (as shown in FIG. 1B). The second main surface 19 receives the user's touch operation in a case where the vibration device 100 is disposed on the housing 2 of the electronic device. The substrate 11 is a printed circuit board, on which wiring (not shown) is formed. The substrate 11 includes a terminal (not shown) on the first main surface 18. The terminal is used to mount a mounting component 17. Note that the substrate 11 is an example of a "flat plate" in the present description.

The vibrator 12 is connected to the first main surface 18 of the substrate 11. The vibrator 12 is connected to the substrate 11 with the double-sided tape 15 interposed therebetween. The double-sided tape 15 is an example of a "connecting member" in the present description. Note that the connecting member may be anything other than a double-sided tape as long as the connecting member connects the vibrator 12 to the substrate 11. The vibrator 12 is connected to a drive circuit (not shown), and constitutes a vibration unit together with the substrate 11.

FIG. 3A is a rear perspective view of the vibrator 12, and FIG. 3B is a sectional view taken along line III-III shown in FIG. 3A. As shown in FIG. 3A, the vibrator 12 has a substantially flat plate shape. The vibrator 12 has a substantially rectangular shape in the plan view. An area of the vibrator 12 is smaller than an area of the first main surface 18 of the substrate 11. A short direction of the vibrator 12 is parallel to the X-axis direction, and a long direction of the vibrator 12 is parallel to the Y-axis direction.

As shown in FIG. 3B, the vibrator 12 includes a vibration film 33, a vibration portion 34, a support portion 35, a frame member 36, and a connection portion 39.

The frame member 36 has a rectangular shape in the plan view. The frame member 36 has two first openings 31 and two second openings 32. The first openings 31 are disposed on both end sides in the Y-axis direction, which is a long direction of the frame member 36. The second openings 32 are disposed on both end sides in the X-axis direction, which is a short direction of the frame member 36. The first opening 31 has a substantially rectangular shape, and is long along the X-axis direction. The second opening 32 is a substantially rectangular opening that is long along the Y-axis direction. Further, both ends in the Y-axis direction of the second opening 32 are further extended in a rectangular shape toward a central axis (line III-III in the diagram) of the frame member 36. Note that the frame member 36 is an example of a "frame portion" in the present description.

The vibration portion 34 has a rectangular shape in the plan view, and is disposed on an inner side of the frame member 36. An area of the vibration portion 34 is smaller than an area surrounded by the frame member 36. Note that the vibration portion 34 is an example of a "diaphragm" in the present description.

The support portion 35 connects the vibration portion 34 and the frame member 36. The support portion 35 supports the vibration portion 34 in the frame member 36. In this example, the support portion 35 has a rectangular shape that is long along the X-axis direction, and holds the vibration portion 34 at both end portions in the Y-axis direction of the vibration portion 34. The length of the support portion 35 in the X-axis direction orthogonal to the Y-axis direction in which the vibration film 33 expands and contracts is longer than the length along the Y-axis direction. Note that the support portion 35 is an example of a "beam portion" in the present description.

The frame member 36, the vibration portion 34, and the support portion 35 are formed of the same material (for example, acrylic resin, PET, polycarbonate, glass epoxy, FRP, metal, glass, or the like). The metal includes, for example, stainless steel material (SUS), and may be insulated by coating with resin such as polyimide as necessary.

The frame member 36, the vibration portion 34, and the support portion 35 are formed by punching a single rectangular plate member along shapes of the first opening 31 and the second opening 32. The frame member 36, the vibration portion 34, and the support portion 35, which may be different materials, can be more easily manufactured by being formed of the same materials. Alternatively, as the frame member 36, the vibration portion 34, and the support portion 35 are formed of the same material, another member (a member with creep deterioration) such as rubber does not need to be used for supporting the vibration portion 34, and the vibration portion 34 can be stably held for a long time.

As shown in FIGS. 3A and 3B, the vibration film 33 is connected to the frame member 36 and the vibration portion 34 with the connection portion 39 interposed therebetween. A first end in a long direction of the vibration film 33 is connected to a first end in the Y-axis direction of the frame member 36. A second end of the vibration film 33 is connected to a second end in the Y-axis direction of the vibration portion 34. An insulating and adhesive material is used for the connection portion 39. The vibration film 33 is connected to the frame member 36 with the connection portion 39 interposed therebetween by, for example, heat welding. In the vibrator 12, a portion where the vibration film 33 is disposed protrudes to the side opposite to the substrate 11 by the thickness of the vibration film 33 and the connection portion 39. That is, in the vibrator 12, a location where the vibration film 33 is disposed is bulky in the Z-axis direction.

The connection portion 39 has a rectangular shape that is long along a short direction of the frame member 36 in the plan view. The connection portion 39 has a certain thickness, and connects the vibration film 33 and the vibration portion 34 at positions separated from each other to some extent, so that the vibration film 33 does not contact the vibration portion 34. In this manner, an electrode (not shown) provided on both main surfaces of the vibration film 33 does not contact the vibration portion 34, so that even if the vibration film 33 expands and contracts and the vibration portion 34 vibrates, the electrode is not scraped.

The vibration film 33 is an example of a piezoelectric film that vibrates by being deformed in a plane direction when a voltage is applied. The vibration film 33 has a rectangular shape that is longer along the long direction of the frame member 36 in the plan view. The vibration film 33 is made from, for example, polyvinylidene fluoride (PVDF). Alternatively, the vibration film 33 may be made from a chiral polymer. As the chiral polymer, for example, L-type polylactic acid (PLLA) or D-type polylactic acid (PDLA) is used.

When PVDF is used for the vibration film 33, since PVDF has water resistance, an electronic device including the vibration member in this example can be vibrated similarly under any humidity environment.

Further, in a case where PLLA is used for the vibration film 33, since PLLA is a highly transmissive material, if an electrode added to PLLA and the vibration portion are made from a transparent material, an internal situation of the device can be visually recognized, and the device can be easily manufactured. Further, since PLLA has no pyroelectricity, similar vibration can be caused under any temperature environment. In a case where the vibration film 33 is configured with PLLA, the vibration film 33 has piezoelectricity by being cut so that each outer peripheral side is approximately 45° with respect to a stretching direction.

The drive circuit applies a voltage to the vibration film 33 to expand and contract the vibration film 33. The vibration film 33 is deformed in the plane direction when voltage is applied. Specifically, the vibration film 33 expands and contracts in the Y-axis direction when voltage is applied. As the vibration film 33 expands and contracts in the long direction, the vibration portion 34 vibrates in the Y-axis direction. That is, the vibrator 12 vibrates in the Y-axis direction. In this manner, vibration generated in the vibration film 33 is transmitted to the user via the vibration portion 34.

The holder 13 is connected to the first main surface 18 of the substrate 11 with the cushion material 14 interposed therebetween. The cushion material 14 is disposed so as to keep a distance between the substrate 11 and the holder 13. The cushion material 14 is formed of a material that is more easily deformed when applied with an external force than the holder 13 and the substrate 11. The cushion material 14 absorbs vibration of the substrate 11. For this reason, little vibration of the substrate 11 is transmitted to the holder 13 and the housing 2. Therefore, the cushion material 14 can suppress transmission of vibration of the substrate 11 to a member other than the substrate 11. Note that the holder 13 is an example of a "support member" in the present description, and the cushion material 14 is an example of a "cushioning material" in the present description.

The holder 13 has a rectangular shape in the plan view. The holder 13 has a cavity 16 at the center thereof. The cavity 16 has a rectangular shape in the plan view. The cavity 16 is formed to have an area larger than the vibrator 12 in the plan view. The cavity 16 is positioned in a portion facing the vibrator 12. That is, the vibrator 12 is positioned on an inner side of the cavity 16 in the plan view.

The vibrator 12 is separated by a gap from the holder 13 in the Y-axis direction in the plan view. Since there is the gap, even when vibrating in the Y-axis direction, the vibrator 12 is less likely to collide with the holder 13. For this reason, the vibration film 33 adhered to the vibrator 12 can be made long in the Y-axis direction. For example, the vibration film 33 can be adhered to the entire vibrator 12 in the Y-axis direction. As described above, when the length of the vibration film 33 in the Y-axis direction increases, the acceleration of the vibration film 33 increases. Therefore, the vibration device 100 can obtain a larger output.

The holder 13 is formed by punching a single rectangular plate member along the shape of the cavity 16. The holder 13 is formed of, for example, acrylic resin, PET, polycarbonate, glass epoxy, FRP, metal, glass, or the like. The metal includes, for example, stainless steel material (SUS), and may be insulated by coating with resin such as polyimide as necessary.

The cushion material 14 is connected to the first main surface 18 of the substrate 11. The cushion material 14 has a substantially rectangular shape, which is long along the X-axis direction. On the first main surface 18, the cushion materials 14 are arranged on both sides in the Y-axis direction with the vibrator 12 interposed therebetween along the Y-axis direction. At this time, a space is provided between the cushion material 14 and the vibrator 12, so that the mounting component 17 can be disposed between the cushion material 14 and the vibrator 12. In this manner, the thickness of the vibration device 100 can be further reduced. Note that the two cushion materials 14 disposed with the vibrator 12 interposed therebetween are examples of a "first cushioning material" and a "second cushioning material" in the present description.

Here, a length (L1) obtained by combining thicknesses of the vibrator 12 and the double-sided tape 15 in the Z-axis direction is longer than a length (L2) of a thickness of the cushion material 14 in the Z-axis direction. The thickness of the double-sided tape 15 is considerably thinner than the vibrator 12. For this reason, part of the vibrator 12 enters the cavity 16. That is, the vibrator 12 protrudes outward from the space surrounded by the cushion material 14 by the amount by which the thickness of the vibrator 12 and the double-sided tape 15 is larger than the thickness of the cushion material 14. Part of the vibrator 12 that protrudes outward from the space surrounded by the cushion material 14 enters the cavity 16 of the holder 13. Note that the entire protruding portion of the vibrator 12 may be shaped to enter the cavity 16.

For example, in a case of a vibration device in which the vibrator 12 and the substrate 11 are laminated on a plate without the cavity 16, the thickness of the vibration device is larger than the thickness of all members (the plate without the cavity 16, the vibrator 12, and the substrate 11) combined. This is because members and the substrate 11 need to be disposed to be separated from each other so as to provide a gap between the vibrator 12 and the cavity 16 so that the vibrator 12 does not contact the cavity 16. On the other hand, in a case where part of the vibrator 12 including the vibration film 33 enters the cavity 16 of the holder 13 as in the present embodiment, the thickness of the vibration device 100 as a whole can be reduced by the thickness of the vibrator 12 that enters the cavity 16 of the holder 13. Further, even if the cushion material 14 is formed thinner by the thickness of the holder 13, the vibrator 12 does not contact surrounding members. Therefore, bulkiness of the vibration device 100 as a whole can be suppressed.

Further, the holder 13 is rigid. Even if a peripheral member of the holder 13 bends, the holder 13 bends little. The cavity 16 of the holder 13 is not easily deformed. The vibrator 12 vibrates in the cavity 16 that is not easily deformed. For this reason, the vibrator 12 does not easily come into contact with the holder 13. Therefore, the vibrator 12 can stably vibrate without being affected by deformation of a surrounding member and the like.

Note that, in the present embodiment, the cushion materials 14 are disposed at two positions so as to sandwich the vibrator 12; however, the present invention is not limited to this mode. The cushion material 14 only needs to be disposed in at least part of surrounding space of the vibrator 12. For example, the cushion material 14 may be disposed in one location or in three or more locations. Further, the cushion material 14 may be formed in a rectangular ring surrounding the periphery of the vibrator 12.

Note that, in the present embodiment, the holder 13 is installed on the housing 2 of the electronic device on which the vibration device 100 is installed; however, the present invention is not limited to this mode. As the holder 13, for example, a chassis of an electronic device on which the vibration device 100 is installed may be used. In this manner, the vibration device 100 can be formed with even less bulkiness.

Figure 4A:
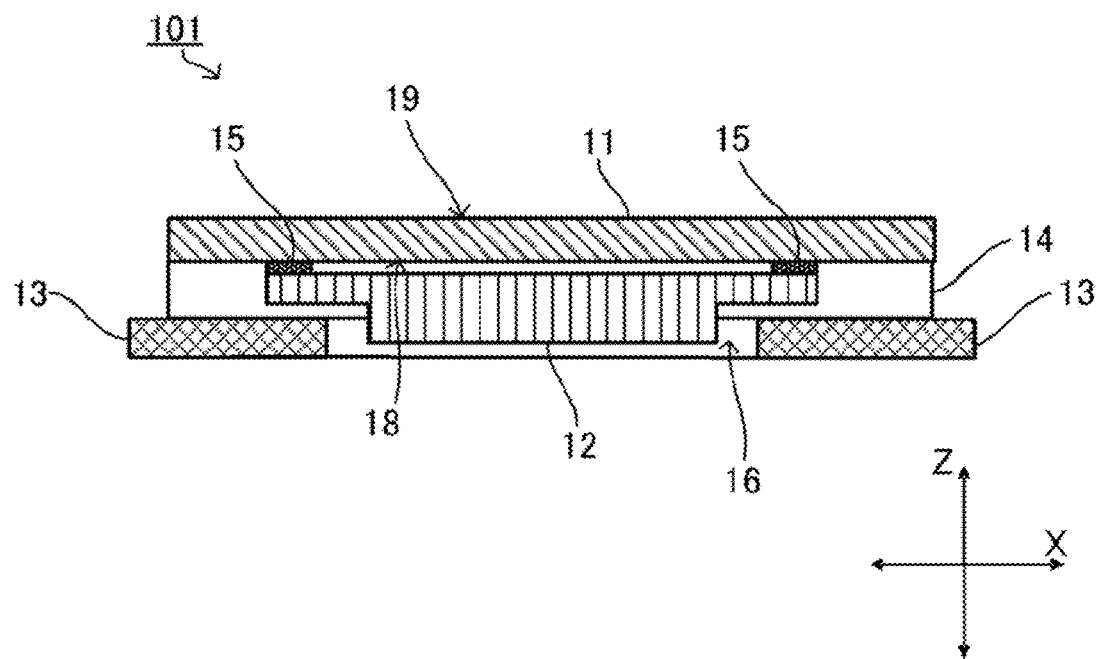
FIG. 4A is a diagram for explaining a first modification of the vibration device 100.
Figure 4B:
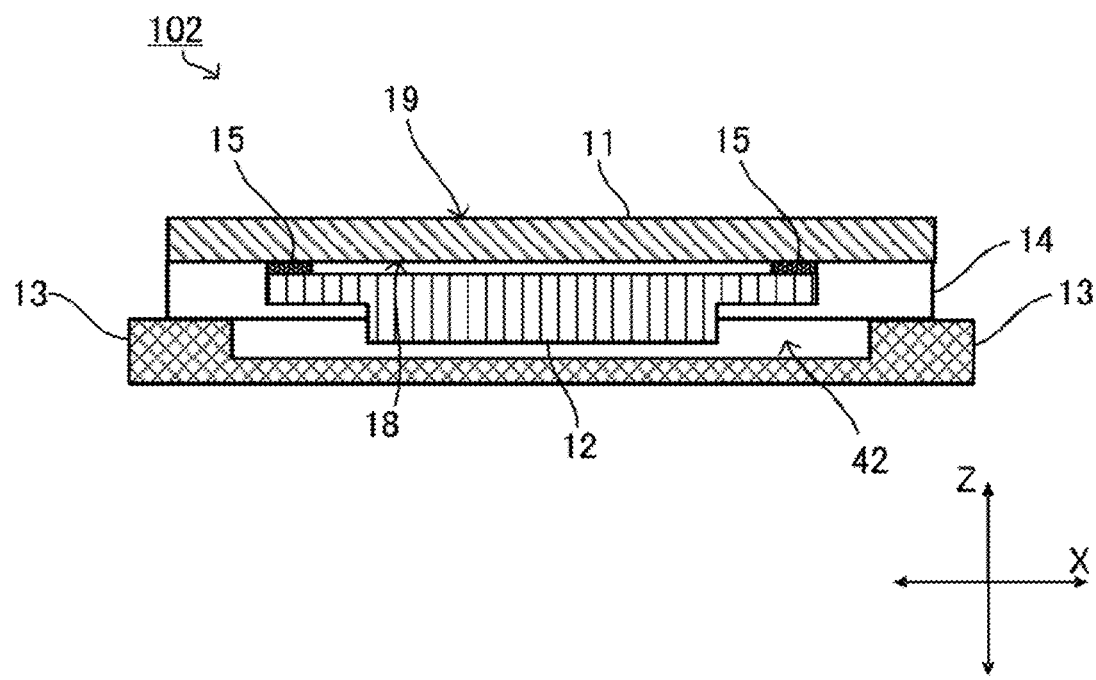
FIG. 4B is a diagram for explaining a second modification of the vibration device 100.

FIG. 4A is a diagram for explaining a first modification of the vibration device 100, and FIG. 4B is a diagram for explaining a second modification of the vibration device 100. In the description of the first and second modifications, only a portion different from the above embodiment will be described, and the rest will be omitted.

As shown in FIG. 4A, in a vibration device 101 according to the first modification, the range in which the cavity 16 of the holder 13 is formed is different from that in the above embodiment, and the other configurations are the same. In the first modification, the cavity 16 partially overlaps the vibrator 12 in the plan view. More specifically, a portion having a small thickness in the Z-axis direction of the vibrator 12, that is, a portion where the vibration film 33 is not disposed of the vibrator 12 overlaps the holder 13 in the plan view. However, the protruding portion of the vibrator 12 can freely vibrate in the cavity 16. Further, since the protruding portion of the vibrator 12 enters the cavity 16, the vibration device 101 as a whole can be formed with less bulkiness.

As shown in FIG. 4B, a vibration device 102 according to the second modification is different from the above embodiment in that a recess 42 is formed in the holder 13, and the other configurations are the same. In the second modification, the holder 13 includes the recess 42. The recess 42 is formed by a recessed part on a surface of the holder 13 facing the vibrator 12. The recess 42 is formed in a portion facing the vibrator 12, like the cavity 16 of the above embodiment. Part of the vibrator 12 enters the recess 42. In this manner, the vibration device 102 can be formed with less bulkiness as a whole.

Finally, the description of the present embodiments is to be considered in all respects as illustrative and not restrictive. The scope of the present invention is indicated not by the above-described embodiments but by the claims. Furthermore, the scope of the present invention is intended to include all modifications within the meaning and scope equivalent to the scope of the claims.

What is claimed is:

1. A vibration device, comprising:
a flat plate that has a first main surface and a second main surface;
a vibrator that is configured to vibrate along a first direction parallel to the first main surface of the flat plate;
a connecting member that connects the vibrator to the first main surface of the flat plate;
a support member having a cavity or a recess in a portion thereof facing the vibrator; and
a cushioning material connecting the first main surface of the flat plate to the support member, the cushioning material being disposed so as to not overlap with the vibrator in a plan view of the vibration device, wherein
a combined length of the vibrator and the connecting member in a second direction perpendicular to the first main surface of the flat plate is larger than a length of the cushioning material in the second direction.

2. The vibration device according to claim 1, wherein the vibrator is separated by a gap from the support member in the first direction in the plan view of the vibration device.

3. The vibration device according to claim 1, wherein
the cushioning material includes a first cushioning material and a second cushioning material, and
the first cushioning material and the second cushioning material are disposed so as to sandwich the vibrator along the first direction.

4. The vibration device according to claim 1, wherein an area of the vibrator is smaller than an area of the first main surface of the flat plate.

5. The vibration device according to claim 1, wherein the vibrator comprises:
a frame portion;
a diaphragm;
a beam portion connecting the frame portion and the diaphragm; and
a piezoelectric film that is disposed on a side facing the cavity or the recess of the support member, and connected to the frame portion and the diaphragm.

6. The vibration device according to claim 5, wherein the frame portion surrounds the diaphragm, and the beam portion supports the diaphragm within the frame portion.

7. The vibration device according to claim 5, wherein the frame portion, the diaphragm, and the beam portion are formed of a same material.

8. The vibration device according to claim 5, further comprising:
a first connection portion connecting the piezoelectric film to the frame portion; and
a second connection portion connecting the piezoelectric film to the diaphragm.

9. The vibration device according to claim 8 wherein the first and second connection portions have a thickness such that the piezoelectric film does not contact the diaphragm.

10. The vibration device according to claim 1, wherein the cushioning material is formed of a material that is more easily deformed when applied with an external force than the support member and the flat plate.

11. The vibration device according to claim 1, wherein the support member has a cavity, and the cavity has an area larger than an area of the vibrator in the plan view.

12. The vibration device according to claim 1, wherein the support member has a cavity, and the cavity partially overlaps the vibrator in the plan view.

13. The vibration device according to claim 1, wherein the support member has a recess, and a part of the vibrator is within the recess.

* * * * *